US011398486B2

(12) United States Patent
Hopkins et al.

(10) Patent No.: US 11,398,486 B2
(45) Date of Patent: Jul. 26, 2022

(54) MICROELECTRONIC DEVICES WITH TIER STACKS WITH VARIED TIER THICKNESSES, AND RELATED METHODS AND SYSTEMS

(71) Applicant: Micron Technology, Inc., Boise, ID (US)

(72) Inventors: John D. Hopkins, Meridian, ID (US); Nancy M. Lomeli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/904,353

(22) Filed: Jun. 17, 2020

(65) Prior Publication Data
US 2021/0398987 A1    Dec. 23, 2021

(51) Int. Cl.
*H01L 27/115* (2017.01)
*H01L 27/11556* (2017.01)
(Continued)

(52) U.S. Cl.
CPC ........ *H01L 27/115* (2013.01); *H01L 27/1157* (2013.01); *H01L 27/11524* (2013.01);
(Continued)

(58) Field of Classification Search
CPC ... H01L 27/112–11597; H01L 27/2481; H01L 27/249
See application file for complete search history.

(56) References Cited

U.S. PATENT DOCUMENTS 9,000,508 B2 * 4/2015 Lee .................. G11C 16/28
                                                 257/319
9,397,107 B2   7/2016 Makala et al.
(Continued)

FOREIGN PATENT DOCUMENTS

KR   10-2020-0028490 A   3/2020
WO   2019/089152 A1      5/2019

OTHER PUBLICATIONS

International Search Report for Application No. PCT/US2021/037471, dated Oct. 6, 2021, 3 pages.
(Continued)

*Primary Examiner* — Andres Munoz
(74) *Attorney, Agent, or Firm* — TraskBritt

(57) ABSTRACT

Microelectronic devices include a stack structure of vertically alternating insulative and conductive structures arranged in tiers. The insulative structures of a lower portion of the stack structure are thicker than the insulative structures of an upper portion. The conductive structures of the lower portion are as thick, or thicker, than the conductive structures of the upper portion. At least one feature may taper in width and extend vertically through the stack structure. The thicker insulative structures of the lower portion extend a greater lateral distance from the at least one feature than the lateral distance, from the at least one feature, extended by the thinner insulative structures of the upper portion. During methods of forming such devices, sacrificial structures are removed from an initial stack of alternating insulative and sacrificial structures, leaving gaps between neighboring insulative structures. Conductive structures are then formed in the gaps. Systems are also disclosed.

21 Claims, 9 Drawing Sheets

(51) Int. Cl.
*H01L 27/1157* (2017.01)
*H01L 27/11582* (2017.01)
*H01L 27/11524* (2017.01)
*H01L 27/11551* (2017.01)
*H01L 27/11578* (2017.01)

(52) U.S. Cl.
CPC ... *H01L 27/11551* (2013.01); *H01L 27/11556* (2013.01); *H01L 27/11578* (2013.01); *H01L 27/11582* (2013.01)

(56) References Cited

U.S. PATENT DOCUMENTS

| | | | |
|---|---|---|---|
| 9,806,090 | B2 | 10/2017 | Sharangpani et al. |
| 9,922,990 | B2* | 3/2018 | Song ................. H01L 27/11582 |
| 10,014,309 | B2 | 7/2018 | Dorhout et al. |
| 10,446,578 | B1 | 10/2019 | Howder et al. |
| 10,497,715 | B2 | 12/2019 | Kim et al. |
| 2013/0161731 | A1* | 6/2013 | Bin ................... H01L 27/11582 257/329 |
| 2013/0193395 | A1 | 8/2013 | Lee |
| 2013/0256775 | A1 | 10/2013 | Shim et al. |
| 2014/0362642 | A1 | 12/2014 | Dong et al. |
| 2015/0255468 | A1 | 9/2015 | Chen |
| 2016/0284723 | A1 | 9/2016 | Rabkin et al. |
| 2016/0293621 | A1* | 10/2016 | Huang .............. H01L 27/11582 |
| 2016/0343728 | A1 | 11/2016 | Song |
| 2017/0062454 | A1 | 3/2017 | Lu et al. |
| 2017/0186765 | A1 | 6/2017 | Koval et al. |
| 2019/0067246 | A1 | 2/2019 | Wu et al. |
| 2021/0125674 | A1 | 4/2021 | Chen et al. |
| 2021/0242235 | A1* | 8/2021 | Lee ................... H01L 27/11582 |

OTHER PUBLICATIONS

Written Opinion of the International Searching Authority for Application No. PCT/US2021/037471, dated Oct. 6, 2021, 4 pages.

* cited by examiner

MICROELECTRONIC DEVICES WITH TIER STACKS WITH VARIED TIER THICKNESSES, AND RELATED METHODS AND SYSTEMS

TECHNICAL FIELD

Embodiments of the disclosure relate to the field of microelectronic device design and fabrication. More particularly, the disclosure relates to methods for forming microelectronic devices (e.g., memory devices, such as 3D NAND memory devices) having tiered stack structures that include vertically alternating conductive structures and insulative structures, to related systems, and to methods for forming such structures and devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line).

In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

To form some 3D NAND memory devices, the stack of tiers is initially formed as an alternating structure of insulating materials and sacrificial materials, which sacrificial materials are subsequently removed and replaced with the conductive materials. Retaining the structural integrity of the insulating materials during the removal of the sacrificial materials and replacement of the conductive materials presents challenges.

DETAILED DESCRIPTION

Figure 1:
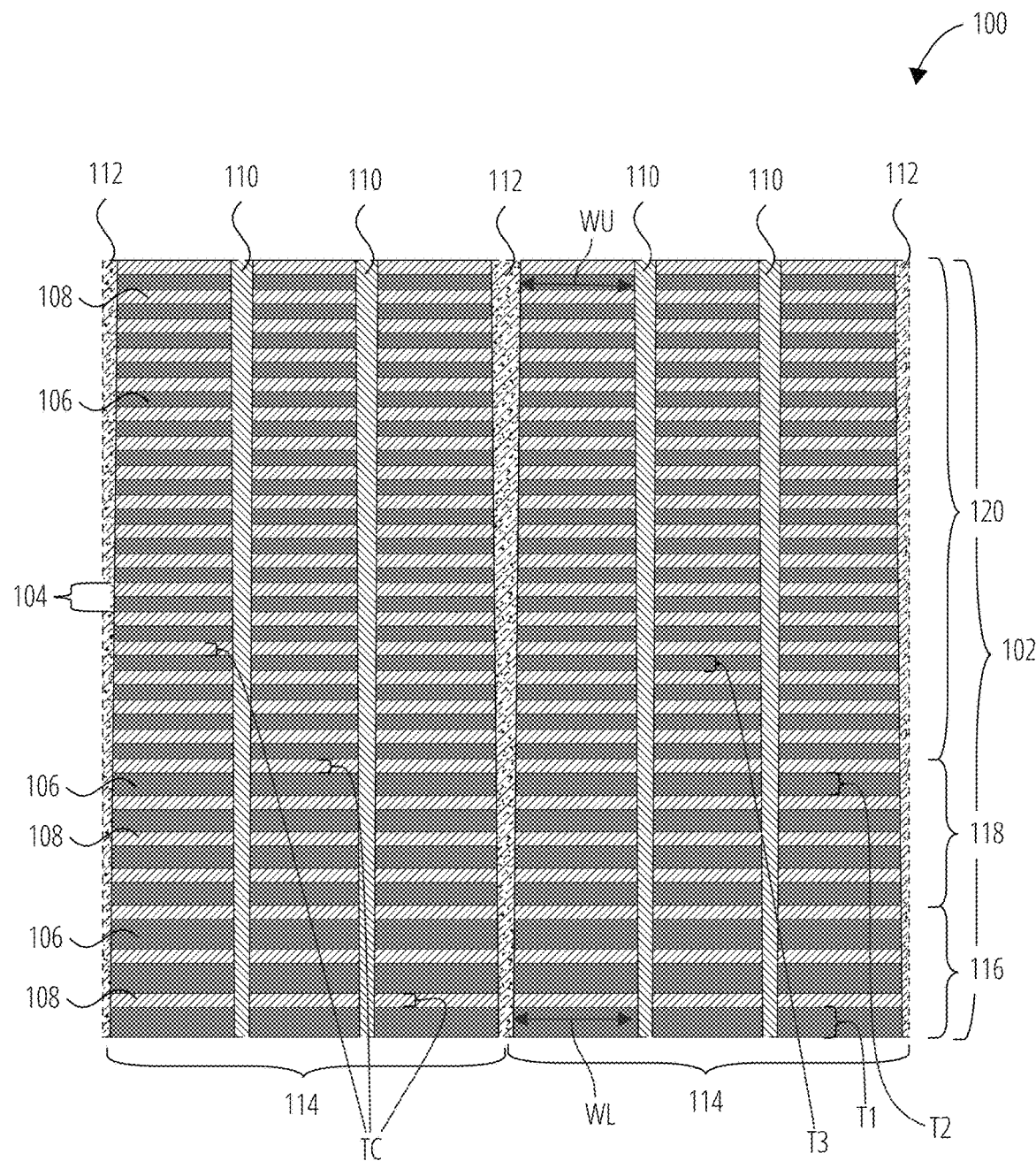
FIG. 1 is a cross-sectional, elevational, schematic illustration of a microelectronic device structure, according to embodiments of the disclosure, with insulative structures of varied thicknesses.

Structures (e.g., microelectronic device structures), apparatus (e.g., microelectronic devices), and systems (e.g., electronic systems), according to embodiments of the disclosure, include a stack of vertically alternating conductive structures and insulative structures in tiers, with the tiers of at least one lower portion of the stack including insulative structures of relatively greater thicknesses (e.g., vertical heights) than the insulative structures of tiers of at least one upper portion of the stack. The at least one lower portion of the stack may include the elevations of the stack at which the tiers of the stack extended furthest (e.g., in a horizontal direction) from neighboring supportive vertical features (e.g., pillars, contacts), which may taper to a minimal width in the lower elevations of the stack. The additional thicknesses of the insulative structures of the lower portion(s) of the stack may improve the structural integrity of the insulative structures during a replacement gate process in which sacrificial material is removed from between the insulative structures, leaving gaps between the insulative structures, such that the insulative structures are less physically supported from above and below. In the less supported stage, the thicker insulative structures may be less prone to the bending, collapse, sagging, or other structural degradations than may otherwise result due to gravity or attraction forces. Accordingly, the replacement gate process may be more reliably completed, with the conductive material(s) formed to fill the gaps between the insulative structures.

As used herein, the term "opening" means a volume extending through at least one structure or at least one material, leaving a gap in that at least one structure or at least one material, or a volume extending between structures or materials, leaving a gap between the structures or materials. Unless otherwise described, an "opening" is not necessarily empty of material. That is, an "opening" is not necessarily void space. An "opening" formed in or between structures or materials may comprise structure(s) or material(s) other than that in or between which the opening is formed. And, structure(s) or material(s) "exposed" within an opening is (are) not necessarily in contact with an atmosphere or non-solid environment. Structure(s) or material(s) "exposed" within an opening may be adjacent or in contact with other structure(s) or material(s) that is (are) disposed within the opening.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, structures, or junctions in the base semiconductor structure or foundation.

As used herein, the term "sacrificial material" means and includes a material that is formed during a fabrication process but which is removed prior to completion of the fabrication process.

As used herein, the terms "horizontal" or "lateral" mean and include a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis and may be parallel to an indicated "X" axis.

As used herein, the terms "vertical" or "longitudinal" mean and include a direction that is perpendicular to a primary surface of the substrate on which a referenced material or structure is located. The height of a respective material or structure may be defined as a dimension in a vertical plane. With reference to the figures, the "vertical" direction may be parallel to an indicated "Z" axis and may be perpendicular to an indicated "X" axis.

As used herein, the terms "thickness" or "thinness"—as used herein—mean and include a vertical dimension of the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the term "consistent"—when referring to a parameter, property, or condition of one structure, material, or feature in comparison to the parameter, property, or condition of another such structure, material, or feature—means and includes the parameter, property, or condition of the two such structures, materials, or features being equal, substantially equal, or about equal, at least in terms of respective portions of such structures, materials, or features. For example, two structures having "consistent" thicknesses as one another may each define a same, substantially same, or about the same thickness at X lateral distance from a feature, despite the two structures being at different elevations along the feature.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the primary surface of the substrate on which the reference material or structure is located. As used herein, a "level" and an "elevation" are each defined by a horizontal plane parallel to the primary surface. "Lower levels" and "lower elevations" are nearer to the primary surface of the substrate, while "higher levels" and "higher elevations" are further from the primary surface. Unless otherwise specified, these spatially relative terms are intended to encompass different orientations of the materials in addition to the orientation as depicted in the figures. For example, the materials in the figures may be inverted, rotated, etc., with the spatially relative "elevation" descriptors remaining constant because the referenced primary surface would likewise be respectively reoriented as well.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a composition (e.g., gas) described as "comprising," "including," and/or "having" a species may be a composition that, in some embodiments, includes additional species as well and/or a composition that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, substructure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

FIG. 1 illustrates a microelectronic device structure 100 (e.g., a memory device structure, such as a 3D NAND memory device structure), according to embodiments of the disclosure, for an apparatus (e.g., a memory device, such as a 3D NAND memory device), which may be included in a system. The microelectronic device structure 100 includes a stack structure 102 having tiers 104, with vertically alternating insulative structures 106 and conductive structures 108. Features 110, such as pillars (e.g., for vertical strings of memory cells) and/or conductive contacts (e.g., electrical contacts to word lines provided by one or more of the conductive structures 108, support contacts), extend through some or all of a vertical height of the stack structure 102. Fill material structures 112 (e.g., regions of fill material, such as a polysilicon fill material) also extend through the stack structure 102, dividing the stack structure 102 into blocks 114. The stack structure 102 may be supported by a substrate or other base structure.

Insulative material(s) of the insulative structures 106 include at least one electrically insulative material (e.g., a dielectric oxide material, such as silicon dioxide). Conductive material(s) of the conductive structures 108 may include one or more conductive materials in one or more material regions. In some embodiments, the conductive structures 108 include a conductive material (e.g., a metal, such as one or more of tungsten (W), molybdenum (Mo), ruthenium (Ru), or cobalt (Co)) within another conductive material (e.g., a conductive liner, such as a metal nitride, e.g., a nitride of one or more of the aforementioned metals, e.g., tungsten nitride), the other conductive material (e.g., the conductive liner) being disposed along portions of the conductive structures 108 adjoining neighboring insulative structures 106 or other features of the microelectronic device structure 100, such as the features 110 (e.g., pillars, conductive contacts).

One or more of the features 110 and/or the fill material structures 112 taper in width (e.g., horizontal dimension, traverse dimension) from upper elevations of the stack structure 102 to lower elevations of the stack structure 102. The slope of the taper may be substantially smooth, without recesses, extensions, steps, or other interrupts in the sidewall that would define sharp changes in slope. Accordingly, at lower elevations of the stack structure 102 the insulative structures 106 extend further between or from the features 110 and/or the fill material structures 112 than at upper elevations of the stack structure 102. Therefore, at lower elevation of the stack structure 102, one of the insulative structures 106 has greater width WL between one of the features 110 and a neighboring one of the fill material structures 112 than a width WU of another one of the insulative structures 106 at an upper elevation of the stack structure 102. Due to the tapering of the features 110 and the fill material structures 112, the "width" of the insulative structure 106 may be its width along its uppermost surface, its width along its midline, or its width along its lowermost surface. Likewise, at a lower elevation of the stack structure 102, one of the insulative structures 106 has a greater width between neighboring features 110 than a width of another one of the insulative structures 106 at an upper elevation of the stack structure 102.

The microelectronic device structure 100 is structured so that the tiers 104—particularly, at least the insulative structures 106 of the tiers 104—of at least one lower portion (e.g., a first portion 116) of the stack structure 102 have a greater thickness (e.g., vertical dimension) than the tiers 104—particularly, at least the insulative structures 106 of the tiers 104—of one or more upper portions (e.g., a second portion 118, a third portion 120) of the stack structure 102. Therefore, the stack structure 102 of the microelectronic device structure 100 includes at least one portion with tiers 104 (and insulative structures 106) of a greater thickness than the thickness of tiers 104 (and insulative structures 106) of at least one other portion, the at least one portion having the greater thickness being at a lower elevation of the stack structure 102 (e.g., vertically below the at least one other portion having the lesser thickness), laterally adjacent the narrowest portions of the tapered, vertical features 110 and/or fill material structures 112.

In the microelectronic device structure 100 of FIG. 1, the stack structure 102 includes a first portion 116, a second portion 118 above the first portion 116, and a third portion 120 above the second portion 118. Each portion is defined by the insulative structures 106 thereof having a same thickness as the other insulative structures 106 of that portion. Accordingly, the insulative structures 106 of the first portion 116 have a thickness T1, which is greater than a thickness T2 of the insulative structures 106 of the second portion 118, which thickness T2 is greater than a thickness T3 of the insulative structures 106 of the third portion 120. For example, thickness T1 may be about 1 nm to about 5 nm (e.g., about 1 nm to about 2 nm) greater than thickness T2, which may be about 1 nm to about 5 nm (e.g., about 1 nm to about 2 nm) greater than thickness T3. The difference between thicknesses T1 and T2 may be about the same or may be different than the difference between thicknesses T2 and T3. The insulative structures 106 of the first portion 116 also have generally greater widths extending from and/or between the features 110 (e.g., width WL) than the widths of the insulative structures 106 of portions above (e.g., width WU in the third portion 120).

In other embodiments, the thicknesses of the insulative structures 106 (and therefore of the tiers 104) may be gradated throughout each respective section and may gradually decrease with increasing elevation in the stack structure 102.

Accordingly, disclosed is a microelectronic device comprising a stack structure comprising a vertically alternating sequence of insulative structures and conductive structures arranged in tiers. A first portion of the stack structure comprises a group of the insulative structures and a group of the conductive structures. A second portion of the stack structure comprises an additional group of the insulative structures and an additional group of the conductive structures. The second portion is above the first portion. At least one feature extends vertically through the stack structure. The at least one feature tapers in lateral width through the stack structure. At least one other structure extends vertically through the stack structure. Sections of the insulative structures and sections of the conductive structures laterally extend between the at least one feature and the at least one other structure. The group of the insulative structures (i.e., the insulative structures within the first portion of the stack structure) span a greater lateral distance between the at least one feature and the at least one other structure than a lateral distance between the at least one feature and the at least one other structure spanned by the additional group of the insulative structures (i.e., the insulative structures within the second portion of the stack structure). The insulative structures of the group of the insulative structures (i.e., the insulative structures within the first portion of the stack structure) are thicker than the insulative structures of the additional group of the insulative structures (i.e., the insulative structures within the second portion of the stack structure).

In some embodiments, the stack structure 102 may include additional portions above the third portion 120, which additional portions may continue to exhibit decreased thicknesses of the tiers 104 (and of at least the insulative structures 106 thereof) relative to portions below (e.g., the third portion 120, the second portion 118, the first portion 116). Accordingly, the tiers 104 and the insulative structures 106 of the lowest most portion (e.g., the first portion 116) may be the thickest tiers 104 and insulative structures 106 of the stack structure 102 (or of a deck of the stack structure 102). In other embodiments, one or more additional portions of the stack structure 102 above the third portion 120 may include tiers 104 (and insulative structures 106) of greater thicknesses than one or more of the portions below.

The first portion 116 may constitute about ten percent (10%) or less (e.g., less than about 6%) of the total number of tiers 104 (and therefore also of the total number of insulative structures 106) of the stack structure 102. The second portion 118 may constitute another about 10% or less of the total number of tiers 104 (and therefore also of the total number of insulative structures 106) of the stack structure 102. The third portion 120 may constitute the majority (e.g., at least 50%) or, in some embodiments, the remainder of the total number of tiers 104 (and therefore also of the total number of insulative structures 106) of the stack structure 102.

The thickness of each conductive structure 108 of the stack structure 102 may be consistent with one another, throughout all portions of the stack structure 102 that include the insulative structures 106 of varied thicknesses. Thus, the conductive structures 108 of the first portion 116 may have a thickness TC that is the same as the thickness TC of the conductive structures 108 of the second portion 118 and that is the same as the thickness TC of the conductive structures 108 of the third portion 120. Nonetheless, because the insulative structures 106 of the various portions (e.g., the first portion 116, the second portion 118, and the third portion 120) have varied respective thicknesses, the tiers 104 of the various portions (e.g., the first portion 116, the second portion 118, and the third portion 120) also have varied respective thicknesses. In some such embodiments, the thickness TC of the conductive structures 108 may be equal to, substantially equal to, or about equal to the thickness T3 of the insulative structures 106 of the third portion 120, as illustrated in the microelectronic device structure 100 of FIG. 1. In other such embodiments, the thickness TC of the conductive structures 108 may be equal to, substantially equal to, or about equal to the thickness T2 of the insulative structures 106 of the second portion 118, the thickness T1 of the insulative structures 106 of the first portion 116, or some other thickness value.

In some embodiments, the thickness TC of the conductive structures 108 may also be varied, in addition to varying the thicknesses of the insulative structures 106, in the various portions (e.g., the first portion 116, the second portion 118, the third portion 120). For example, and with reference to FIG. 2, a microelectronic device structure 200 may include a stack structure 202, with the tiers 104 providing the vertically alternating insulative structures 106 and conductive structures 108, that includes a first portion 204, a second portion 206, and a third portion 208. The insulative structures 106 and the conductive structures 108 of the first portion 204 may be thicker (at thicknesses T1 and TC1, respectively) than the insulative structures 106 and the conductive structures 108 of the second portion 206 (at thicknesses T2 and TC2, respectively), which may be thicker than the insulative structures 106 and the conductive structures 108 of the third portion 208 (at thicknesses T3 and TC3, respectively). In some embodiments, within each of the portions, the insulative structures 106 and the conductive structures 108 may have consistent thicknesses, such that thickness T1 may be equal to, substantially equal to, or about equal to thickness TC1, thickness T2 may be equal to, substantially equal to, or about equal to thickness TC2, and thickness T3 may be equal to, substantially equal to, or about equal to thickness TC3.

Accordingly, disclosed is a microelectronic device. The microelectronic device comprises a stack structure. The stack structure comprises a vertically alternating sequence of insulative structures and conductive structures arranged in tiers. The stack structure has a lower portion and an upper portion. The lower portion comprises some of the insulative structures and some of the conductive structures. The upper portion comprises some other of the insulative structures and some other of the conductive structures. The some of the insulative structures within the lower portion of the stack structure are thicker than the some other of the insulative structures within the upper portion of the stack structure. The some of the conductive structures within the lower portion of the stack structure are at least as thick as the some other of the conductive structures within the upper portion of the stack structure.

Figure 2:
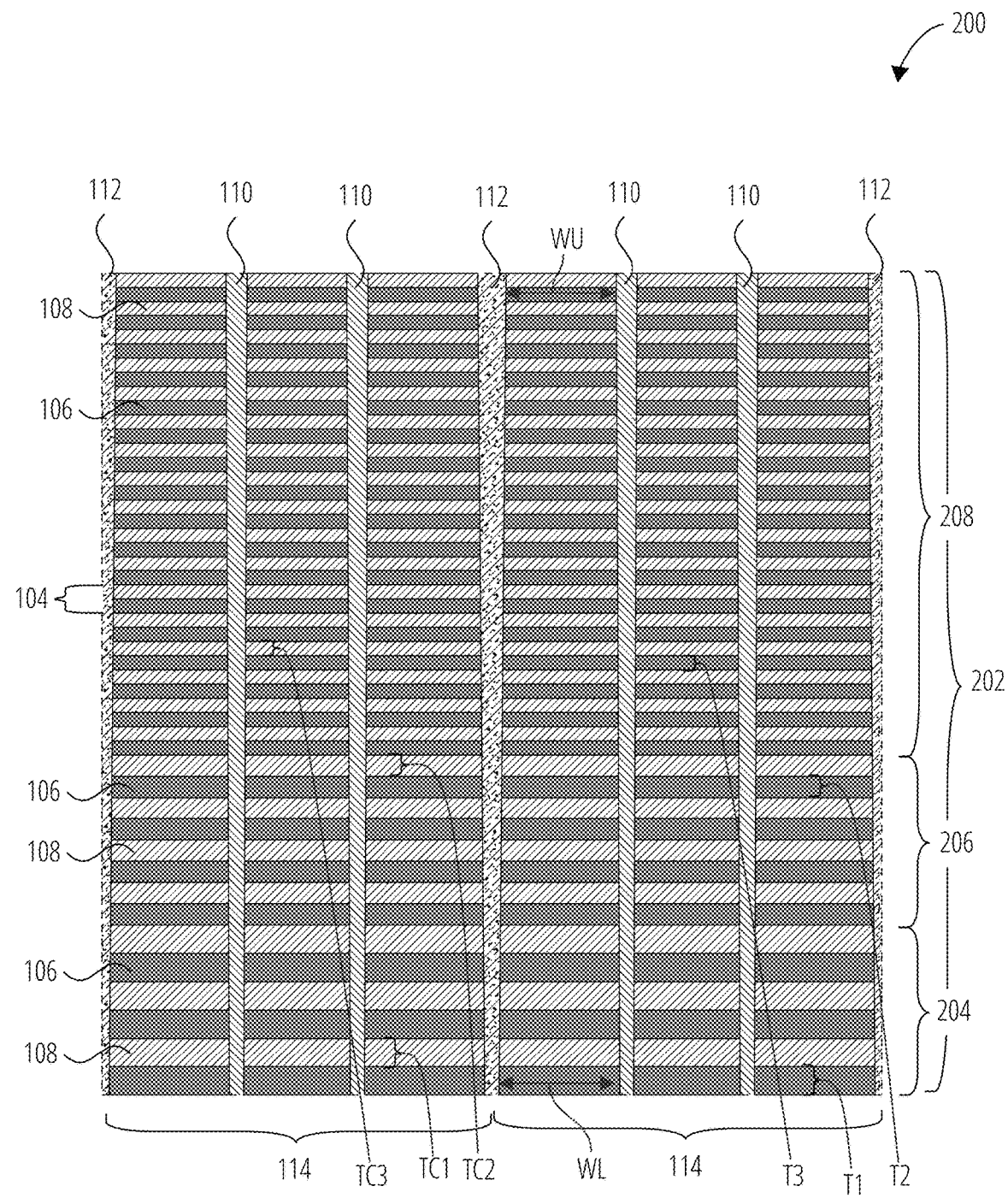
FIG. 2 is a cross-sectional, elevational, schematic illustration of a microelectronic device structure, according to embodiments of the disclosure, with insulative structures of varied thicknesses and with conductive structures of varied thicknesses.

With continued reference to FIG. 2, the first portion 204 may constitute about 10% or less (e.g., less than about 6%) of the total number of tiers 104 (and, therefore, also of the total number of insulative structures 106) of the stack structure 202. The second portion 206 may constitute another about 10% or less of the total number of tiers 104 (and of the total number of insulative structures 106) of the stack structure 202. The third portion 208 may constitute a majority (e.g., at least 50%) or, in some embodiments, the remainder of the total number of tiers 104 (and of the total number of insulative structures 106) of the stack structure 202.

In other embodiments, the conductive structures 108 of only the first portion 204 may be thicker than the conductive structures 108 of the portions above. Nonetheless, the tiers 104 of at least the first portion 204 are thicker than at least some of the tiers 104 of one or more portions above (e.g., the second portion 206, the third portion 208) at least due to the greater thickness of the insulative structures 106 of the first portion 116 if not also due to greater thickness of the conductive structures 108 of the first portion 116, relative to overlying portions of the stack structure 202.

As with the microelectronic device structure 100 of FIG. 1, the microelectronic device structure 200 of FIG. 2 may also include additional portions above the third portion 208, which additional portions may include insulative structures 106 and/or conductive structures 108 that are thinner or thicker than the insulative structures 106 and/or conductive structures 108 of lower portions of the stack structure 202 of the microelectronic device structure 200.

Figure 3:
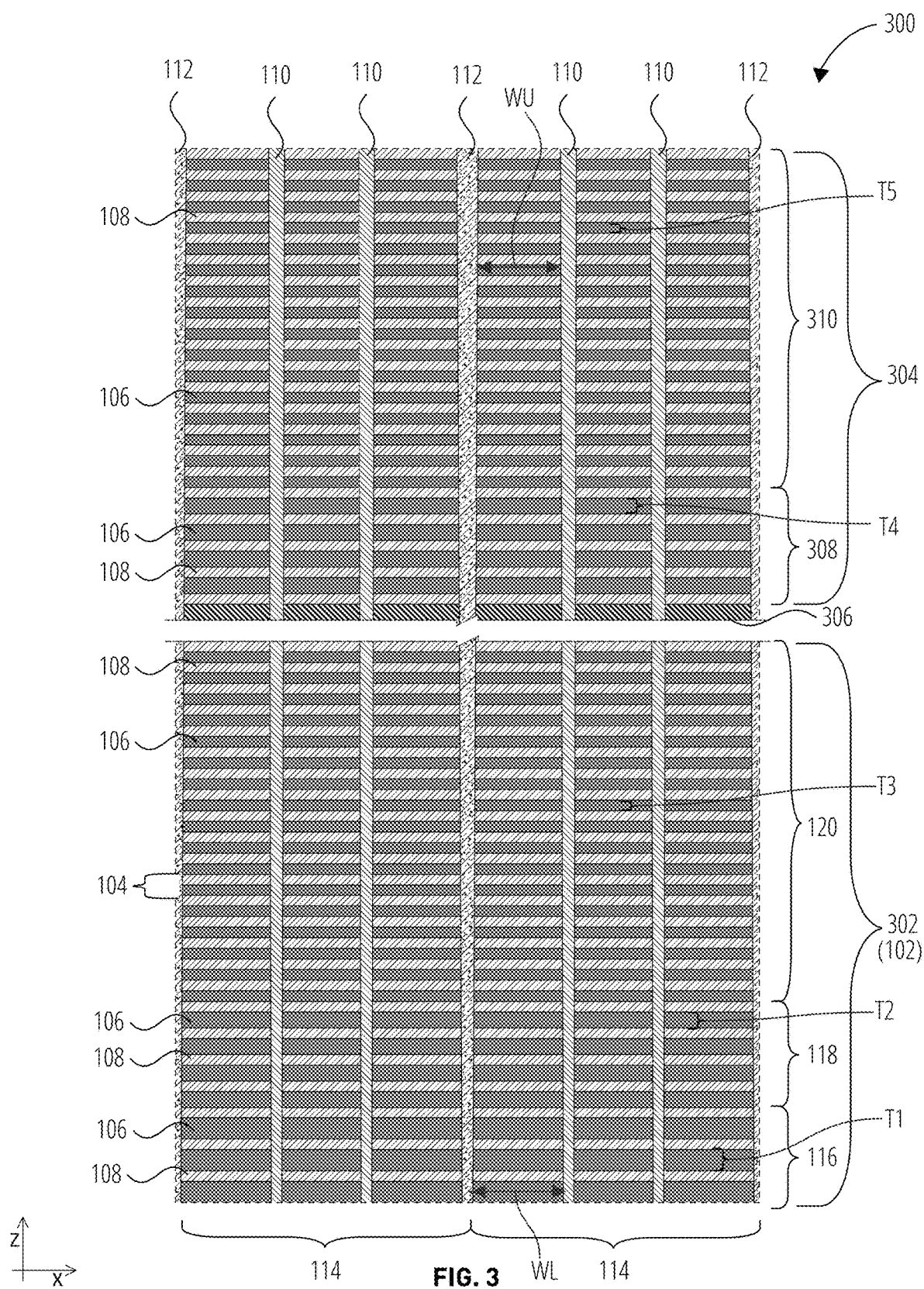
FIG. 3 is a cross-sectional, elevational, schematic illustration of a microelectronic device structure, according to embodiments of the disclosure, with multiple decks of tiers including insulative structures of varied thicknesses.

In some embodiments, the stack structure 102 of the microelectronic device structure 100 of FIG. 1 or the stack structure 202 of the microelectronic device structure 200 of FIG. 2 may represent one deck (e.g., a lowest deck) of a device structure that includes multiple decks, each deck including a stack of tiers of vertically alternating conductive structures and insulative structures, such as illustrated in FIG. 3. For example, a microelectronic device structure 300 may include the stack structure 102 of the microelectronic device structure 100 of FIG. 1 as a first deck 302. The microelectronic device structure 300 also includes a second deck 304 above the first deck 302. A dielectric structure 306 (e.g., an interlayer dielectric structure) may be disposed between the first deck 302 from the second deck 304. In embodiments in which the stack structure 102 (i.e., the first deck 302) includes additional portions, tiers 104, insulative structures 106, and/or conductive structures 108 above the third portion 120, these too would be disposed between the illustrated stack structure 102 of the first deck 302 and the second deck 304. The features 110 and/or the fill material structures 112 may taper through a height of the microelectronic device structure 300, with wider portions along the second deck 304 than along the first deck 302.

In some embodiments, the second deck 304 may also include tiers 104 of varied thickness, e.g., at least one portion (e.g., a fourth portion 308) in a lower elevation of the second deck 304 that includes at least insulative structures 106 with greater thicknesses T4 than thicknesses T5 of insulative structures 106 of tiers 104 of at least one other portion (e.g., a fifth portion 310) in an upper elevation of the second deck 304. In some embodiments, the conductive structures 108 of the at least one portion (e.g., the fourth portion 308) in the lower elevation of the second deck 304 are also thicker than the conductive structures 108 of the at least one other portion (e.g., the fifth portion 310) in the upper elevation of the second deck 304.

The thickness T4 of the insulative structures 106 of the lowest portion (e.g., the fourth portion 308) of the second deck 304 may be less than the thickness T1 of the insulative structures 106 of the lowest portion (e.g., the first portion 116) of the first deck 302. For example, thickness T4 may be about 1 nm to about 5 nm thinner than thickness T1. In some such embodiments, the thickness T4 of the insulative structures 106 of the lowest portion (e.g., the fourth portion 308) of the second deck 304 may be greater than the thickness T3 of the insulative structures 106 of the uppermost portion (e.g., third portion 120) of the first deck 302. For example, thickness T4 may be about 1 nm to about 5 nm thicker than thickness T3. The thickness T5 of the insulative structures 106 of the uppermost portion (e.g., fifth portion 310) of the second deck 304 may be about 1 nm to about 5 nm thinner than the thickness T4 of the insulative structures 106 of the lowermost portion (e.g., fourth portion 308) of the second deck 304.

In some embodiments, the thickness T4 of the insulative structures 106 of the lowest portion (e.g., fourth portion 308) of the second deck 304 may be equal to, substantially equal to, or about equal to the thickness T2 of the insulative structures 106 of the second-lowest portion (e.g., second portion 118) of the first deck 302.

While FIG. 3 illustrates the conductive structures 108 as having consistent thicknesses throughout all of the portions of the decks (e.g., throughout the first portion 116, the second portion 118, and the third portion 120 of the first deck 302 as well as through the fourth portion 308 and the fifth portion 310 of the second deck 304), in other embodiments, the thicknesses of the conductive structures 108 may be varied in a similar relative manner as that of the insulative structures 106 of the microelectronic device structure 300.

Accordingly, disclosed is a microelectronic device comprising a lower deck and an upper deck above the lower deck. The lower deck comprises a first stack structure. The first stack structure comprises a first portion comprising a first vertically alternating sequence of insulative structures and conductive structures arranged in tiers; a second portion above the first portion, the second portion comprising a second vertically alternating sequence of insulative structures and conductive structures arranged in tiers; and a third portion above the second portion, the third portion comprising a third vertically alternating sequence of insulative structures and conductive structures arranged in tiers. The insulative structures of the first portion have greater thicknesses than thicknesses of the insulative structures of the third portion. The upper deck comprises a second stack structure. The second stack structure comprises a fourth portion above the third portion of the lower deck, the fourth portion comprising a fourth vertically alternating sequence of insulative structures and conductive structures arranged in tiers; and a fifth portion above the fourth portion, the fifth portion comprising a fifth vertically alternating sequence of insulative structures and conductive structures arranged in tiers. The insulative structures of the fourth portion have greater thicknesses than thicknesses of the insulative structures of the third portion.

Microelectronic device structures of embodiments of the disclosure—e.g., the microelectronic device structure 100 of FIG. 1, the microelectronic device structure 200 of FIG. 2, and/or the microelectronic device structure 300 of FIG. 3—enable fabrication methods that avoid structural degradation to the insulative structures 106 of those portions of the stack structures (e.g., the stack structure 102 of FIG. 1, the stack structure 202 of FIG. 2, the first deck 302 and the second deck 304 of FIG. 3) that would otherwise be vulnerable to bending, collapse, sagging, or other structural degradations during replacement gate processes. Avoiding such structural degradations also facilitates formation of the conductive structures 108 in a reliable manner.

Various stages of a method of fabrication are illustrated in FIG. 4 to FIG. 8. Though the illustrated stages are most particularly related to a method for fabricating the microelectronic device structure 100 of FIG. 1 (e.g., the first deck 302 of the microelectronic device structure 300 of FIG. 3), a method of fabricating the microelectronic device structure 200 of FIG. 2 and/or the second deck 304 of the microelectronic device structure 300 of FIG. 3 would be similar, as discussed below.

Methods of fabrication, according to embodiments of the disclosure, include forming a stack structure 402 with tier 404 providing vertically alternating insulative structures 106 and sacrificial structures 406. The sacrificial structures 406 comprise at least one sacrificial material, such as a dielectric material differing in composition from the insulative material(s) of the insulative structures 106. For example, the at least one sacrificial material may comprise a dielectric nitride material, such as silicon nitride (e.g., in embodiments in which the insulative structures 106 comprise an oxide dielectric material, such as silicon dioxide).

The stack structure 402 is formed by forming (e.g., depositing) the insulative material(s) of the insulative structures 106 and the sacrificial material(s) of the sacrificial structures 406 in sequence, one after the other, from lower elevations to upper elevations, forming first the first portion 116, then the second portion 118, then the third portion 120.

In forming the insulative material(s) of the insulative structures 106 the insulative material(s) of the first portion 116 are formed to a thickness of at least about thickness T1 (FIG. 1), the insulative material(s) of the second portion 118 are formed to a thickness of at least about thickness T2 (FIG. 1), and the insulative material(s) of the third portion 120 are formed to a thickness of at least about thickness T3 (FIG. 1). To form these insulative structures 106 at the varied thicknesses, the deposition of the insulative material(s) of the insulative structures 106 of the first portion 116 may be carried out for a longer period of time than the deposition of the insulative material(s) of the insulative structures 106 of the second portion 118, which may be carried out for a longer period of time than the deposition of the insulative material(s) of the insulative structures 106 of the third portion 120. As discussed further below, in some embodiments, the thicknesses to which the insulative structures 106 are formed may be tailored according to an expected partial removal of the insulative material(s) during exhumation of the sacrificial structures 406.

In embodiments in which the microelectronic device structure to be formed includes conductive structures 108 of varied thicknesses, as in the microelectronic device structure 200 of FIG. 2, the conductive structures 108 are formed, in the stack structure 402, to approximately their intended final thicknesses (e.g., thickness TC of FIG. 1 or thicknesses TC1, TC2, and TC3 of FIG. 2). As discussed further below, in some embodiments, the thicknesses to which the conductive structures 108 are formed may be tailored according to an expected partial removal of the insulative material(s) during exhumation of the sacrificial structures 406.

Figure 5:
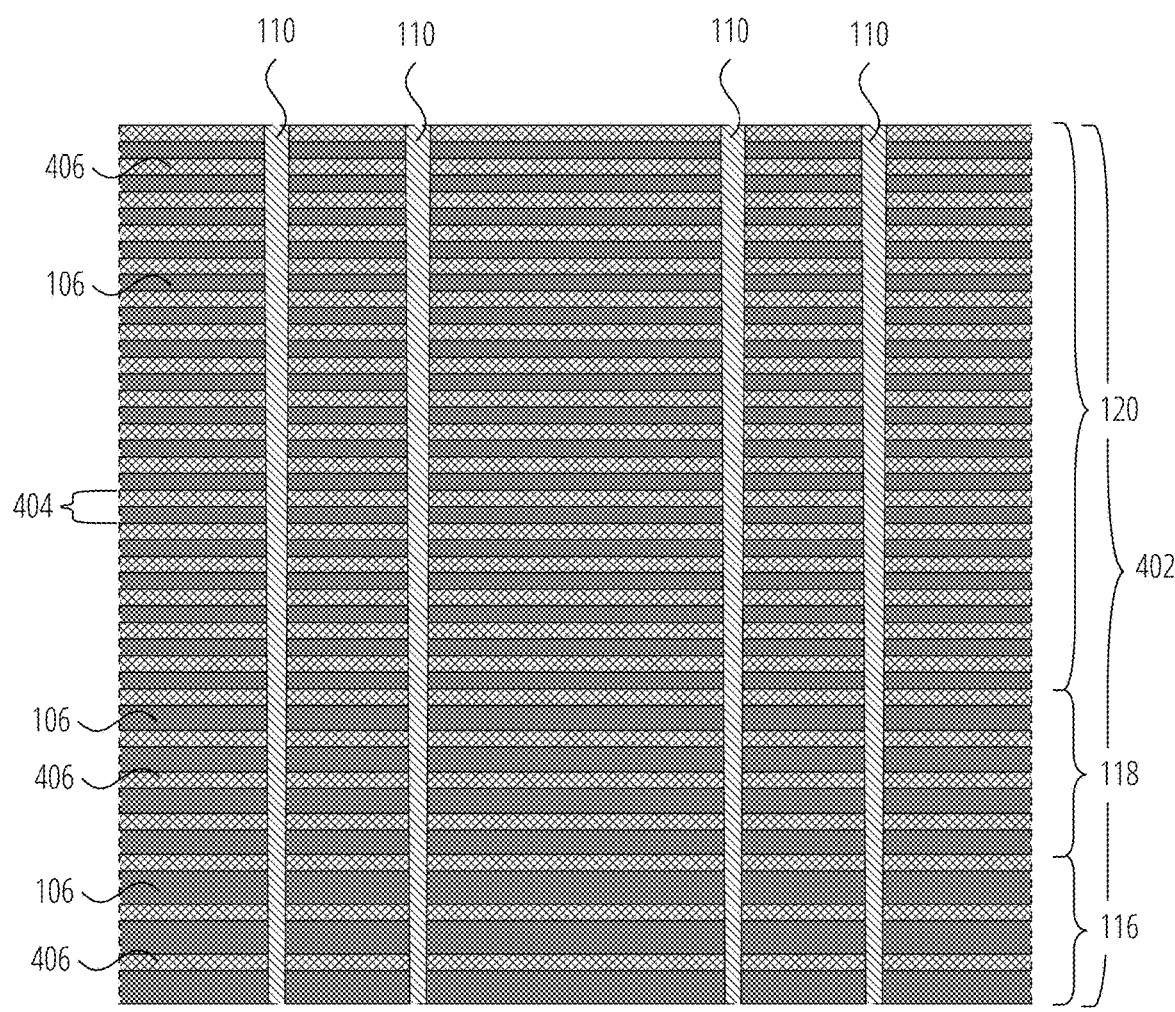

With reference to FIG. 5, openings may then be formed (e.g., etched) to extend through the stack structure 402, and then the material(s) of the features 110 (e.g., materials of pillars, materials of conductive contacts) may be formed (e.g., deposited) to at least partially fill (e.g., substantially fill) the openings to form the features 110 extending through the stack structure 402. Though it may be desirable to form the openings with perfectly vertical sidewalls through the stack structure 402, it is understood in the art that practical limitations on material-removal processes (e.g., etching processes) inherently result in move material removal in upper elevations of a stack structure (e.g., the stack structure 402) than at lower elevations. Thus, realistically, the openings are likely to be exhibit a tapering width (e.g., horizontal dimension, transverse dimension) from a widest width at the top of the stack structure 402 to a narrowest width at the bottom of the stack structure 402. The features 110 formed in the openings therefore also exhibit the tapering.

Figure 6:
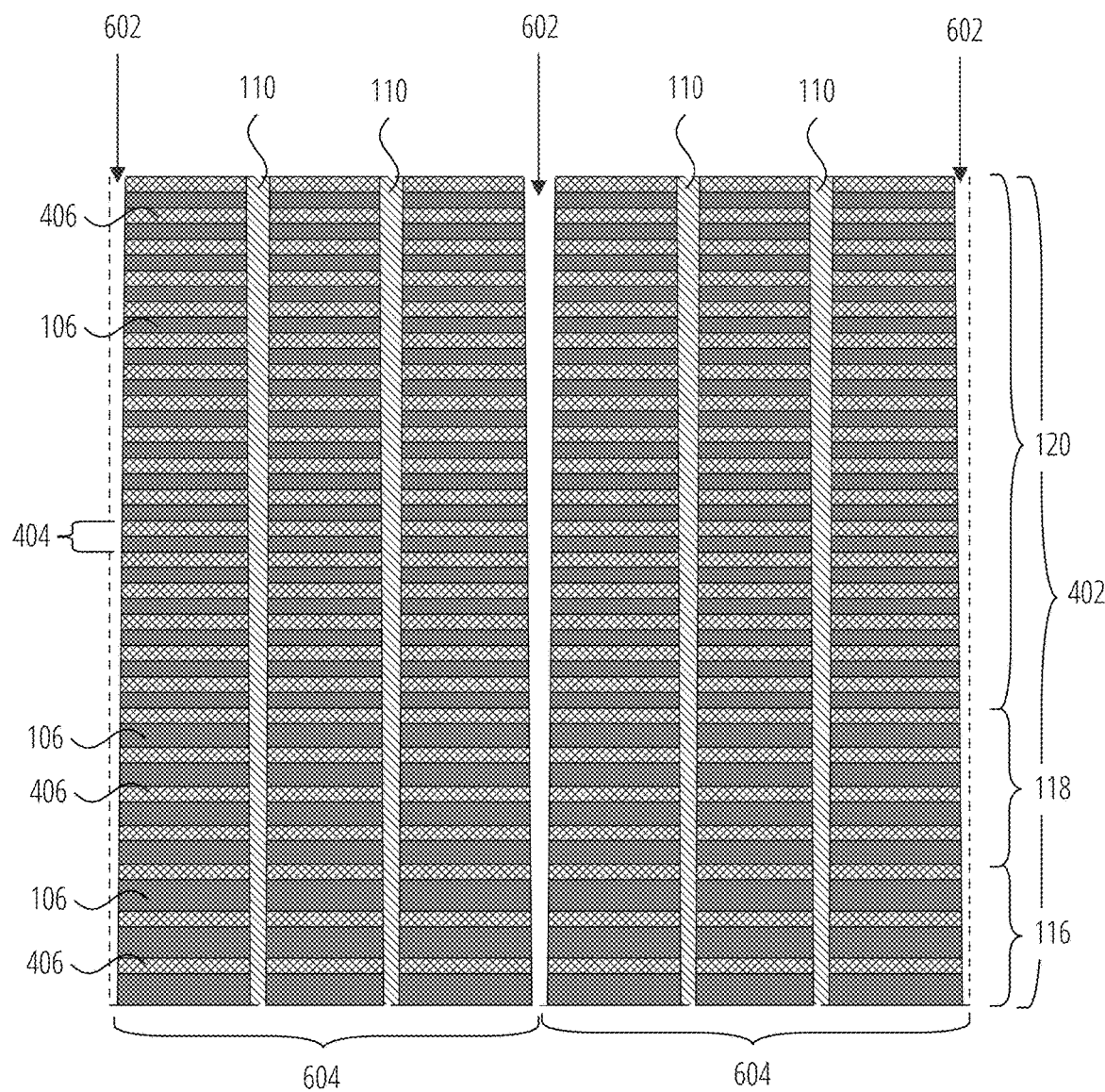

With reference to FIG. 6, slits 602 may then be formed (e.g., etched) through the stack structure 402 to define block portions 604. As with the formation of the openings and the features 110 of FIG. 5, forming the slits 602 may also form the slits 602 to exhibit tapering through the elevations of the stack structure 402, due to practical limitations on material-removal processes (e.g., etching processes).

Figure 7:
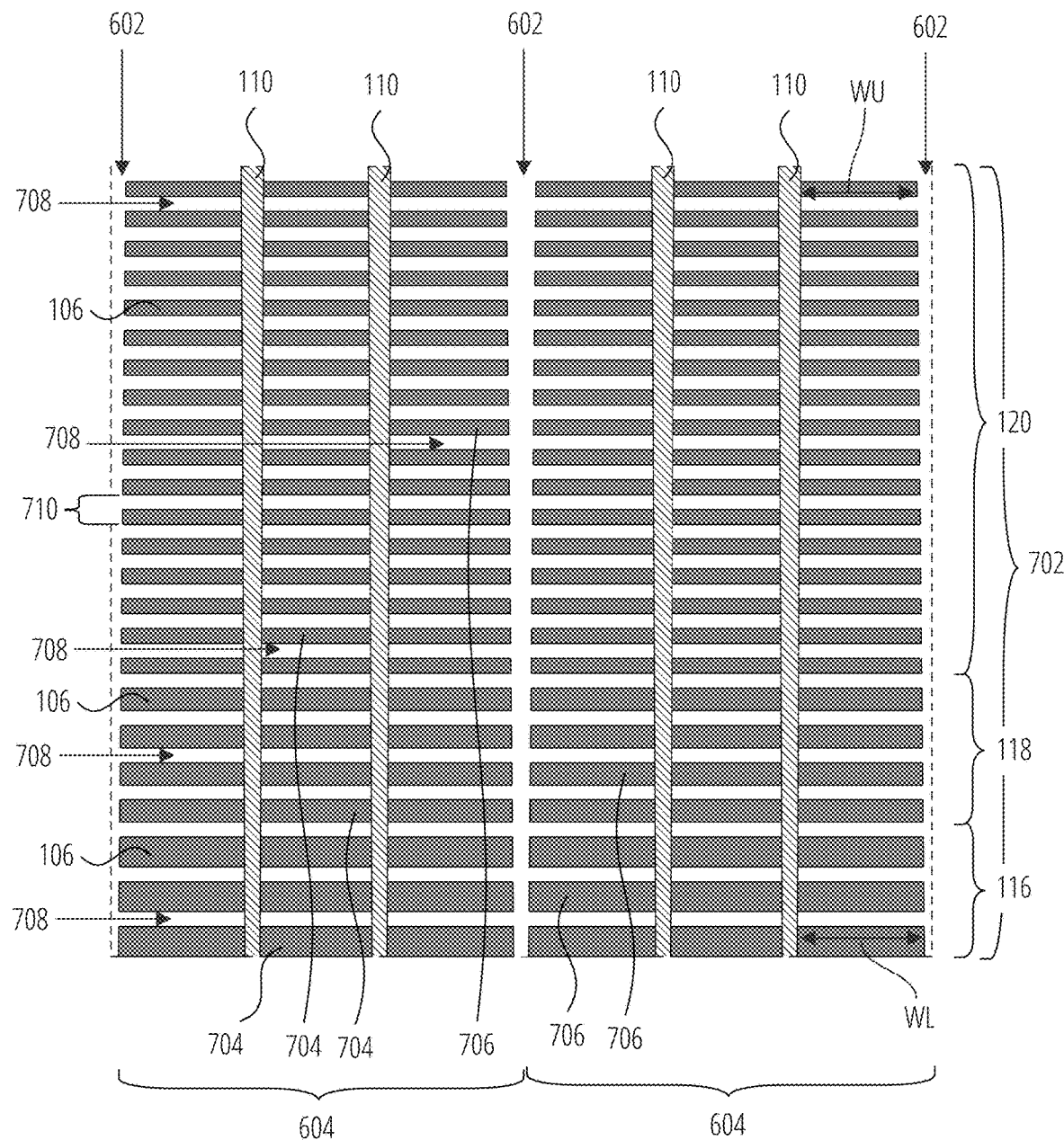

Referring next to FIG. 7, a replacement gate process is then performed to at least partially (e.g., substantially) remove (e.g., exhume) the sacrificial material(s) of the sacrificial structures 406 (FIG. 6). As illustrated in FIG. 7, the stack structure 702 includes span portions 704 of insulative structures 106, spanning between neighboring features 110, and cantilever portions 706 of insulative structures 106 laterally extending from (e.g., projecting from) one of the features 110. Due to removal (e.g., exhumation) of the sacrificial material(s) of the sacrificial structures 406 (FIG. 6), gaps 708 remain between neighboring insulative structures 106. In some embodiments, the tiers 710 of the stack structure 702 are formed to only include the insulative structures 106 vertically alternating with gaps 708.

Each span portion 704 may be substantially unsupported from above and below. Moreover, each cantilever portion 706 may be substantially unsupported from above, below, and along the lateral side bordering one of the slits 602. Moreover, due to the tapering of the features 110 and the slits 602, the widths WL of the insulative structures 106 left unsupported in the lower portions of the stack structure 702 may be greater than the widths WU of the insulative structures 106 left unsupported in the upper portions of the stack structure 702. For example, one of the cantilever portions 706 in the first portion 116 of the stack structure 702 extends laterally further from its respective one of the features 110 than one of the cantilever portions 706 in the third portion 120 of the stack structure 702. Likewise, one of the span portions 704 in the first portion 116 extends laterally further from one respective feature 110 to another than does one of the span portions 704 in the third portion 120 of the stack structure 702. If the insulative structures 106 throughout the stack structure 702 were formed of a consistent thickness, the insulative structures 106 (i.e., the cantilever portions 706 and the span portions 704) of the first portion 116, near the bottom of the stack structure 702, would have a horizontally longer portions and greater mass left unsupported due to the gaps 708 than compared to the insulative structures 106 (e.g., the cantilever portions 706 and the span portions 704) of the third portion 120. Understandably, the insulative structures 106 of the second portion 118 would have horizontally longer portions and greater unsupported mass than respective insulative structures 106 of the third portion 120 but would have horizontally shorter portions and less unsupported mass than respective insulative structures 106 of the first portion 116. With longer regions, more mass, and less support, the cantilever portions and span portions in the first portion 116 may—if they had been formed to the same thickness as those of the uppermost insulative structures 106—may succumb to gravitational and/or attraction forces and bend, collapse, sag, or otherwise structurally degrade into or along the gaps 708. These structurally degradations may be the more pronounced if the openings for the features 110 or the slits 602 should happen to be formed somewhat offset (e.g., nearer to one lateral side than the other) so as to leave an even longer horizontal width of unsupported insulative structure 106 along a cantilever portion 706 or a span portion 704.

To inhibit or avoid the otherwise-possible bending, collapsing, sagging, or other structurally degrading discussed above, at least the insulative structures 106 of the relatively lower portion(s) (e.g., the first portion 116, the first portion 116 and the second portion 118) of the stack structure 702 are formed thicker than the insulative structures 106 of the uppermost portion(s) (e.g., the third portion 120) of the stack structure 702. The thicker insulative structures 106 in at least the first portion 116 facilitate span portions 704 and cantilever portions 706 that are relatively more rigid and relatively less prone to bending, collapsing, sagging, or otherwise structural degrading due to gravitational or attraction forces. Thus, the thickness of the insulative structures 106 of the first portion 116 may be tailored according to the structural strength and rigidity needed, for the resulting span portions 704 and cantilever portions 706, to avoid the aforementioned structural degradations.

In some embodiments, the removal (e.g., exhumation) of the sacrificial material(s) of the sacrificial structures 406 (FIG. 6) may result in some removal of insulative material(s) from the insulative structures 106 as well. Therefore, in forming the stack structure 402 of FIG. 4, the insulative structures 106 may be formed to a thickness equal to, substantially equal to, or about equal to thicknesses of the insulative structures 106 expected to be removed during the removal (e.g., exhumation) of the sacrificial material(s) plus the final expected thicknesses of the insulative structures 106 of the microelectronic device structure (e.g., the microelectronic device structure 100 of FIG. 1, the microelectronic device structure 200 of FIG. 2, the microelectronic device structure 300 of FIG. 3); and the sacrificial structures 406 (FIG. 4) may be formed to a thickness equal to, substantially equal to, or about equal to final expected thicknesses of the conductive structures 108 of the microelectronic device structure (e.g., the microelectronic device structure 100 of FIG. 1, the microelectronic device structure 200 of FIG. 2, the microelectronic device structure 300 of FIG. 3) less the thicknesses of the insulative structures 106 expected to be removed during the removal (e.g., exhumation) of the sacrificial material(s). For example, if the sacrificial material(s) exhumation is expected to remove about 2 nm of insulative material(s) from each of the insulative structures 106, then the insulative structures 106 of the first portion 116 may initially be formed in the stack structure 402 of FIG. 4 to a thickness of final thickness T1 (e.g., FIG. 1) plus 2 nm; the insulative structures 106 of the second portion 118 may initially be formed in the stack structure 402 of FIG. 4 to a thickness of final thickness T2 (e.g., FIG. 1) plus 2 nm; and the insulative structures 106 of the third portion 120 may initially be formed in the stack structure 402 to a thickness of final thickness T3 (e.g., FIG. 1) plus 2 nm. Likewise, in this example, each of the sacrificial structures 406 may initially be formed in the stack structure 402 of FIG. 4 to a thickness of final conductive structure 108 thickness TC (e.g., FIG. 1) less 2 nm.

Figure 8:
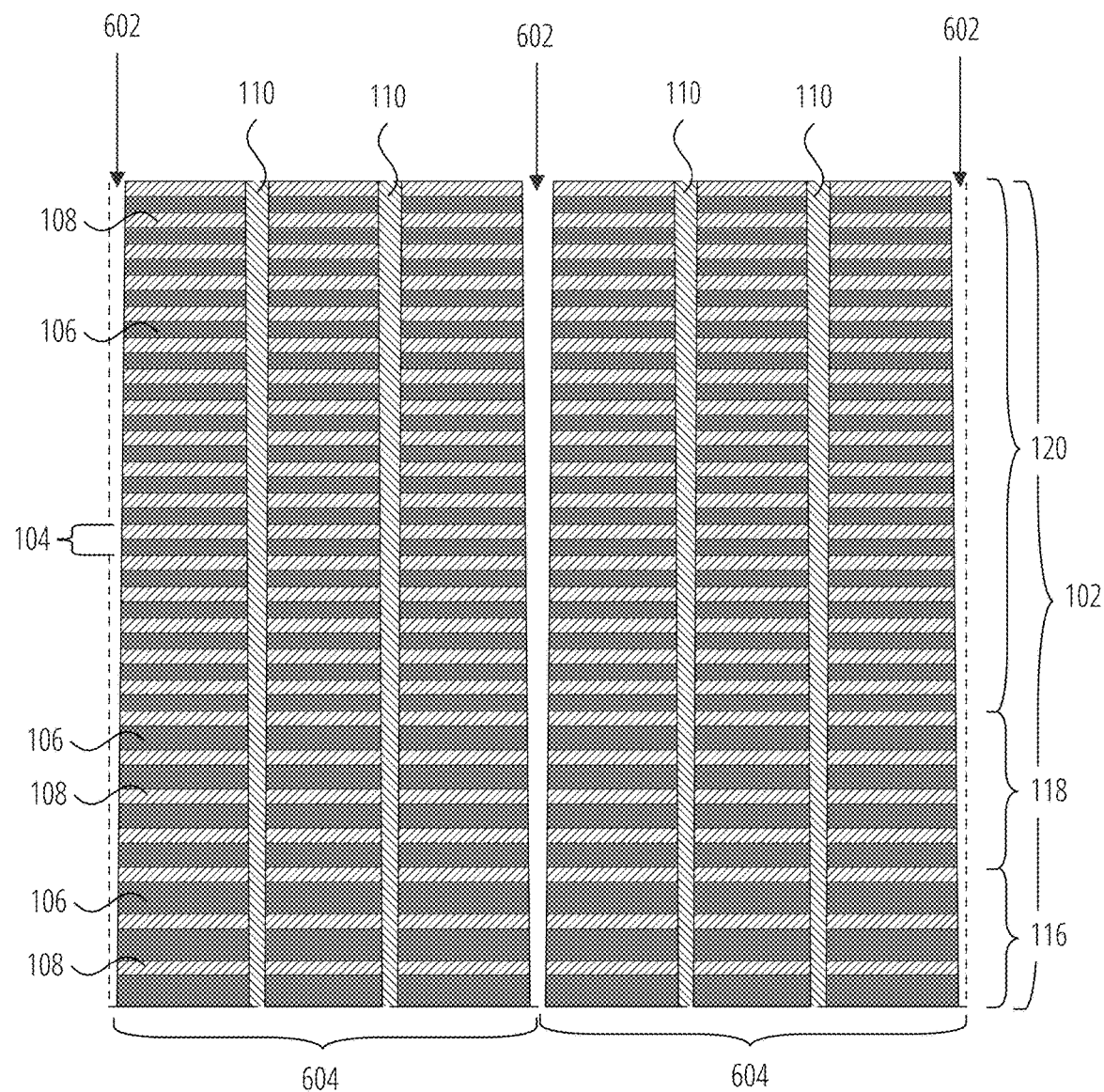

After the removal (e.g., exhumation) of the sacrificial material(s) of the sacrificial structures 406 (FIG. 6), as illustrated in FIG. 7, the conductive material(s) of the conductive structures 108 (e.g., FIG. 1) may then be formed to fill the gaps 708, as illustrated in FIG. 8. For example, a conductive liner (e.g., tungsten nitride) may be formed first, to line the insulative structures 106 and the features 110 exposed by the gaps 708 (FIG. 7), and then a conductive material (e.g., tungsten) may be formed to fill remaining space of the gaps 708. Methods for forming such conductive structures 108 in gaps 708 after sacrificial material exhumation are known in the art and so are not described in detail herein.

Due to the improved structural integrity of the insulative structures 106 in the lower portion(s) (e.g., the first portion 116 and, in some embodiments, also the second portion 118) of the stack structure 102—and, therefore, the mitigation (e.g., prevention) of bending, collapsing, sagging, or other structural degradations of the insulative structures 106 into or along the gaps 708 (FIG. 7), the gaps 708 may be more reliably open and accessible to the formation, in the gaps 708, of the conductive material(s) of the conductive structures 108 than if the insulative structures 106 had not been formed with the varied thicknesses to mitigate the possible bending, collapsing, sagging, or other structural degradation. In embodiments in which the conductive structures 108 of the lowermost portion(s) (e.g., the first portion 116 and the second portion 118) are also varied, the greater thicknesses of the respective sacrificial structures 406 (FIG. 4) in the lowermost portion(s) (e.g., the first portion 116 and the second portion 118) may also enable reliable access to form the conductive material(s) of the conductive structures 108 in the gaps 708 during the fabrication stage illustrated in FIG. 8.

The slits 602 remain, after forming the conductive material(s) of the conductive structures 108, either by forming the conductive material(s) to fill only the gaps 708 (FIG. 7) without extending further into the slits 602 or by overfilling the gaps 708 and then performing another material-removal (e.g., etching) stage to re-form the slits 602 to define the block portions 604. The slits 602 may then be filled by forming fill material(s) (e.g., a dielectric material) within the slits 602 to form the microelectronic device structure (e.g., the microelectronic device structure 100 of FIG. 1).

It should be recognized that forming the microelectronic device structure 200 of FIG. 2 may include the same method acts described above, with respect to forming the microelectronic device structure 100 of FIG. 1, but with appropriate adjustments to the thicknesses of the sacrificial structures 406 (and therefore, the resulting conductive structures 108) of the first portion 204, the second portion 206, and the third portion 208.

Figure 4:
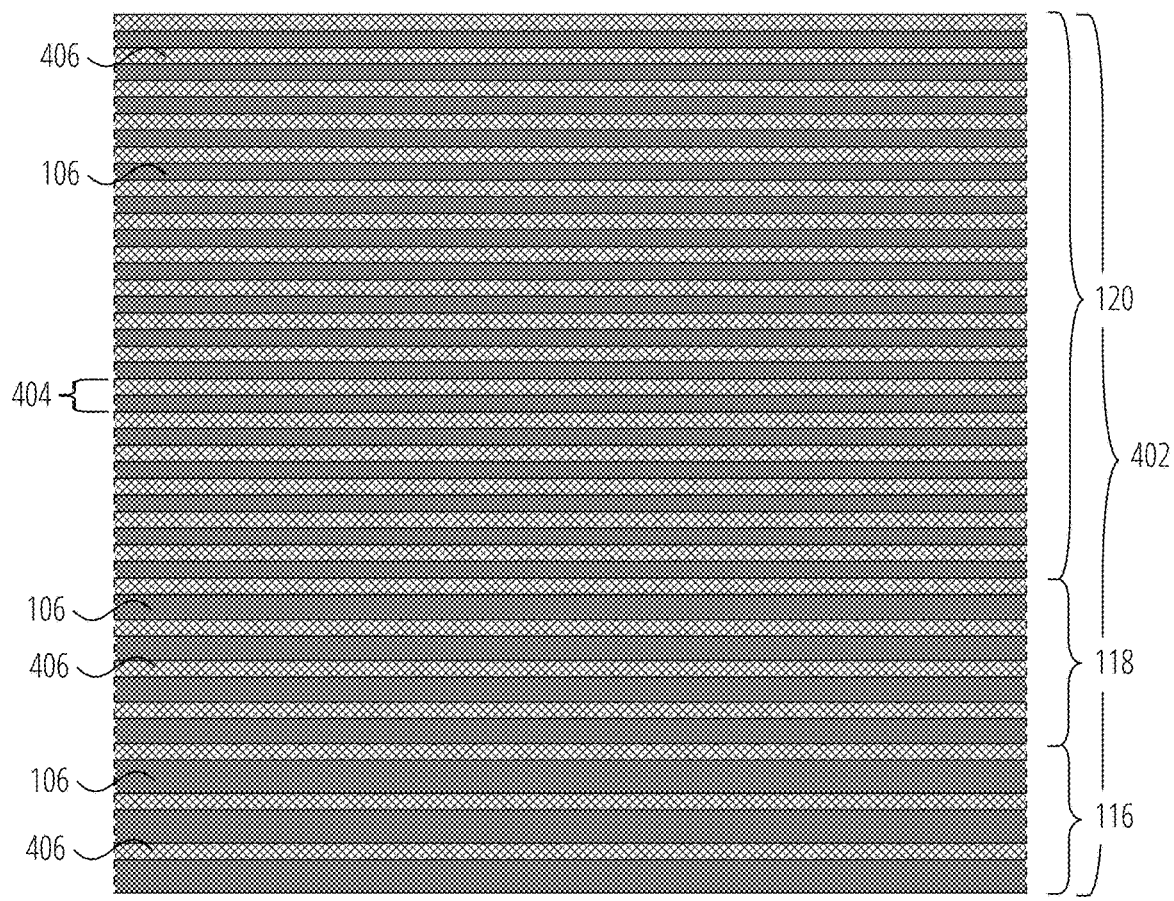
FIG. 4 through FIG. 8 are cross-sectional, elevational, schematic illustrations during various stages of processing to fabricate the microelectronic device structure illustrated in FIG. 1, according to embodiments of the disclosure.
Figure 4:
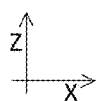

It should also be recognized that forming the microelectronic device structure 300 of FIG. 3 may include the same method acts described above, with respect to forming the microelectronic device structure 100 of FIG. 1, but with forming the stage of FIG. 4 further including forming the dielectric structure 306 over the stack structure 102 (and any additional materials above the stack structure 102), and the materials of the second deck 304 over the dielectric structure 306, with the thicknesses to which the insulative structures 106 and the sacrificial structures 406 (and therefore the conductive structures 108) of the fourth portion 308 and the fifth portion 310 adjusted accordingly. After forming the first deck 302, the dielectric structure 306, and the second deck 304, the features 110 may be formed through the second deck 304, through the dielectric structure 306, and through the first deck 302 in a manner similar to that discussed above with respect to FIG. 5. Then the slits 602 (FIG. 6) may be formed through the second deck 304, through the dielectric structure 306, and through the first deck 302 in a manner similar to that discussed above with respect to FIG. 6. The removal (e.g., exhumation) of the sacrificial structures 406 and the formation of the replacement conductive material(s) of the conductive structures 108 may then be carried out as discussed above with respect to FIG. 7 and FIG. 8.

Accordingly disclosed is a method of forming a microelectronic device. The method comprises forming a stack structure comprising a vertically alternating sequence of insulative structures and sacrificial structures arranged in tiers. Forming the stack structure comprises forming some of the insulative structures in a lower portion of the stack structure and forming some of the insulative structures in an upper portion of the stack structure. The some of the insulative structures (i.e., the insulative structures within the lower portion of the stack structure) are formed to be thicker than the some other of the insulative structures (i.e., the insulative structures within the upper portion of the stack structure). The method also includes removing the sacrificial structures to form gaps between vertically neighboring pairs of the insulative structures. At least one conductive material is formed within the gaps to form conductive structures vertically alternating with the insulative structures.

Figure 9:
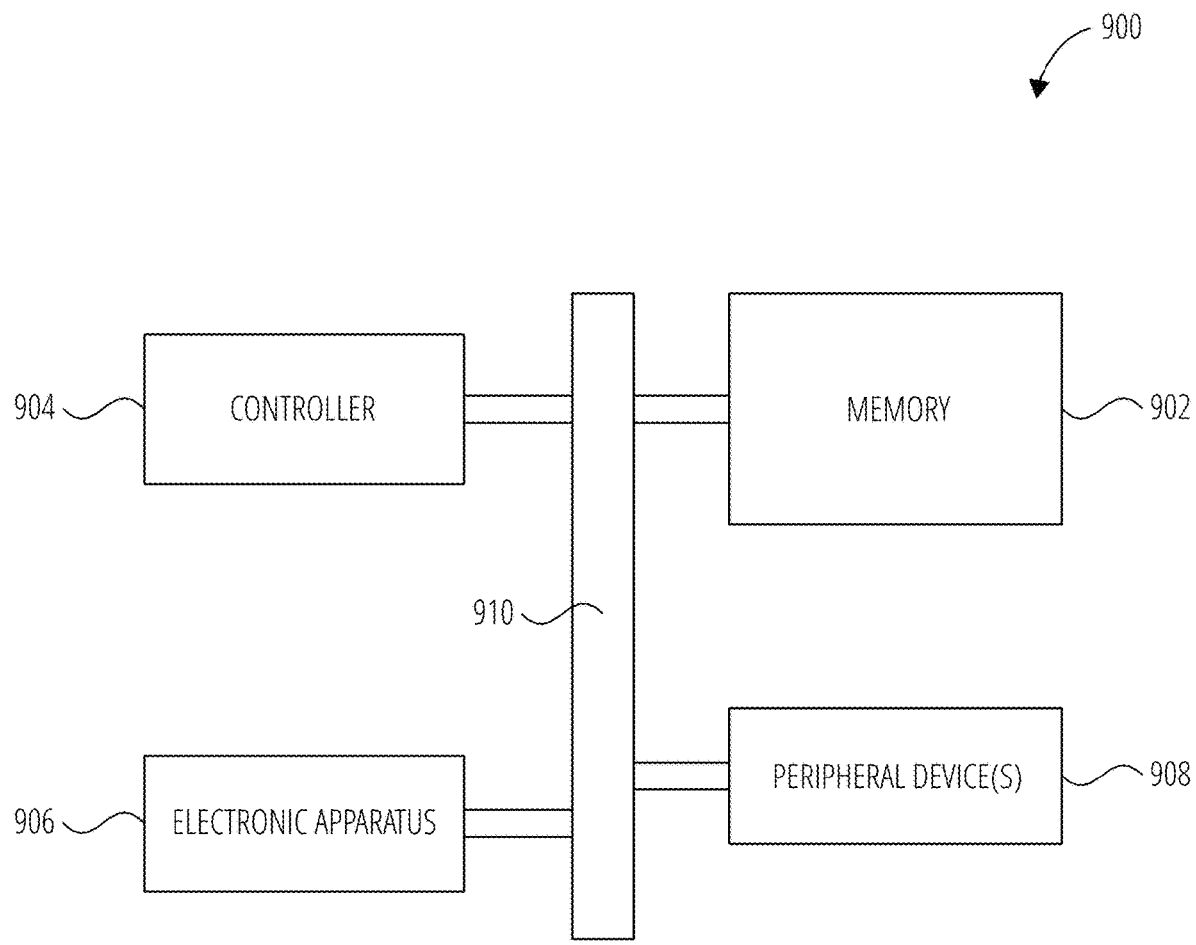
FIG. 9 shows a block diagram of an electronic system including a microelectronic device that includes a microelectronic device structure of embodiments of the disclosure.

FIG. 9 shows a block diagram of a system 900, according to embodiments of the disclosure, which system 900 includes memory 902 including stack structures with tiers of varied thicknesses, including at least insulative structures 106 of varied structures. The architecture and structure of the memory 902 may include one or more of the microelectronic device structure 100 of FIG. 1, the microelectronic device structure 200 of FIG. 2, and/or the microelectronic device structure 300 of FIG. 3, according to embodiments of the disclosure, and may be fabricated according to one or more of the methods described above.

The system 900 may include a controller 904 operatively coupled to the memory 902. The system 900 may also include another electronic apparatus 906 and one or more peripheral device(s) 908. The other electronic apparatus 906 may, in some embodiments, include one or more of the microelectronic device structure 100 of FIG. 1, the microelectronic device structure 200 of FIG. 2, and/or the microelectronic device structure 300 of FIG. 3, according to embodiments of the disclosure and fabricated according to one or more of the methods described above. One or more of the controller 904, the memory 902, the other electronic apparatus 906, and the peripheral device(s) 908 may be in the form of one or more integrated circuits (ICs).

A bus 910 provides electrical conductivity and operable communication between and/or among various components of the system 900. The bus 910 may include an address bus, a data bus, and a control bus, each independently configured. Alternatively, the bus 910 may use conductive lines for providing one or more of address, data, or control, the use of which may be regulated by the controller 904. The controller 904 may be in the form of one or more processors.

The other electronic apparatus 906 may include additional memory (e.g., with one or more of the microelectronic device structure 100 of FIG. 1, the microelectronic device structure 200 of FIG. 2, and/or the microelectronic device structure 300 of FIG. 3, according to embodiments of the disclosure and fabricated according to one or more of the methods described above). Other memory structures of the memory 902 and/or the other electronic apparatus 906 may be configured in an architecture other than 3D NAND, such as dynamic random access memory (DRAM), static random access memory (SRAM), synchronous dynamic random access memory (SDRAM), synchronous graphics random access memory (SGRAM), double data rate dynamic ram (DDR), double data rate SDRAM, and/or magnetic-based memory (e.g., spin-transfer torque magnetic RAM (STT-MRAM)).

The peripheral device(s) 908 may include displays, imaging devices, printing devices, wireless devices, additional storage memory, and/or control devices that may operate in conjunction with the controller 904.

The system 900 may include, for example, fiber optics systems or devices, electro-optic systems or devices, optical systems or devices, imaging systems or devices, and information handling systems or devices (e.g., wireless systems or devices, telecommunication systems or devices, and computers).

Accordingly, disclosed is a system comprising a three-dimensional array of memory devices, at least one processor in communication with the three-dimensional array of memory devices, and at least one peripheral device in operable communication with the at least one processor. The three-dimensional array of memory devices comprises a stack structure comprising a vertically alternating sequence of insulative structures and conductive structures arranged in tiers. The stack structure has a first portion and a second portion above the first portion. Features extend vertically through the stack structure. Each of the features tapers in lateral width through the stack structure. Sections of the insulative structures of the first portion of the stack structure span a greater lateral distance between neighboring features, of the features, than a lateral distance between the neighboring features spanned by sections of the insulative structures of the second portion of the stack structure. The insulative structures of the first portion have greater thicknesses than thicknesses of the insulative structures of the second portion.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
a stack structure comprising a vertically alternating sequence of insulative structures and conductive structures arranged in tiers, multiple of the conductive structures providing word lines, the stack structure having a lower portion and an upper portion; and
at least one tapering feature extending vertically through the stack structure,
the lower portion comprising some of the insulative structures and some of the conductive structures providing some of the word lines,
the upper portion comprising some other of the insulative structures and some other of the conductive structures providing some other of the word lines,
the some of the insulative structures vertically spacing the some of the word lines from one another within the lower portion of the stack structure being thicker than the some other of the insulative structures vertically spacing the some other of the word lines from one another within the upper portion of the stack structure, and
the some of the conductive structures within the lower portion of the stack structure being at least as thick as the some other of the conductive structures within the upper portion of the stack structure.

2. The microelectronic device of claim 1, wherein:
the stack structure further has an additional portion comprising further of the insulative structures and further of the conductive structures; and
the further of the insulative structures within the additional portion of the stack structure are thicker than the some other of the insulative structures within the upper portion of the stack structure and thinner than the some of the insulative structures within the lower portion of the stack structure.

3. The microelectronic device of claim 1, wherein the some of the conductive structures within the lower portion of the stack structure are thicker than the some other of the conductive structures within the upper portion of the stack structure.

4. The microelectronic device of claim 1, wherein the some of the conductive structures within the lower portion of the stack structure are substantially as thick as the some of the insulative structures within the lower portion of the stack structure.

5. The microelectronic device of claim 1, further comprising an additional stack structure above the stack structure, the additional stack structure comprising an additional vertically alternating sequence of additional insulative structures and additional conductive structures arranged in additional tiers.

6. The microelectronic device of claim 5, wherein:
the additional stack structure has a lower portion comprising some of the additional insulative structures and some of the additional conductive structures; and
the some of the additional insulative structures of the lower portion of the additional stack structure are thicker than the some other of the insulative structures of the upper portion of the stack structure.

7. The microelectronic device of claim 6, wherein the some of the additional insulative structures of the lower portion of the additional stack structure are thinner than the some of the insulative structures of the lower portion of the stack structure.

8. The microelectronic device of claim 1, wherein the at least one tapering feature comprises a conductive contact structure.

9. The microelectronic device of claim 1, wherein:
the some of the insulative structures of the lower portion comprise multiple of the insulative structures having substantially a same first thickness as one another; and
the some other of the insulative structures of the upper portion comprise an other multiple of the insulative structures having substantially a same second thickness as one another.

10. A microelectronic device, comprising:
a stack structure comprising a vertically alternating sequence of insulative structures and conductive structures arranged in tiers, a first portion of the stack structure comprising a group of the insulative structures and a group of the conductive structures, a second portion of the stack structure comprising an additional group of the insulative structures and an additional group of the conductive structures, the second portion being above the first portion;

at least one feature extending vertically through the stack structure, the at least one feature tapering in lateral width through the stack structure; and at least one other structure extending vertically through the stack structure, sections of the insulative structures and sections of the conductive structures laterally extending between the at least one feature and the at least one other structure, the group of the insulative structures within the first portion of the stack structure spanning a greater lateral distance between the at least one feature and the at least one other structure than a lateral distance between the at least one feature and the at least one other structure spanned by the additional group of the insulative structures within the second portion of the stack structure, the insulative structures of the group of the insulative structures within the first portion being thicker than the insulative structures of the additional group of the insulative structures within the second portion, and wherein each of the conductive structures of the group of the conductive structures within the first portion of the stack structure and each of the conductive structures of the additional group of the conductive structures within the second portion of the stack structure have substantially equal thicknesses.

11. The microelectronic device of claim 10, wherein:
the insulative structures comprise an oxide material; and
the conductive structures comprise a metal and a metal nitride liner.

12. A microelectronic device, comprising:
a lower deck comprising a first stack structure, the first stack structure comprising:
  a first portion comprising a first vertically alternating sequence of insulative structures and conductive structures arranged in tiers;
  a second portion above the first portion, the second portion comprising a second vertically alternating sequence of insulative structures and conductive structures arranged in tiers; and
  a third portion above the second portion, the third portion comprising a third vertically alternating sequence of insulative structures and conductive structures arranged in tiers,
  the insulative structures of the first portion having greater thicknesses than thicknesses of the insulative structures of the third portion, and
an upper deck above the lower deck, the upper deck comprising a second stack structure, the second stack structure comprising:
  a fourth portion above the third portion of the lower deck, the fourth portion comprising a fourth vertically alternating sequence of insulative structures and conductive structures arranged in tiers; and
  a fifth portion above the fourth portion, the fifth portion comprising a fifth vertically alternating sequence of insulative structures and conductive structures arranged in tiers,
  the insulative structures of the fourth portion having greater thicknesses than thicknesses of the insulative structures of the third portion,
wherein:
  of the lower deck:
    the insulative structures of the first portion are about 1 nm to about 5 nm thicker than the insulative structures of the second portion; and
    the insulative structures of the second portion are about 1 nm to about 5 nm thicker than the insulative structures of the third portion; and
  of the upper deck:
    the insulative structures of the fourth portion are about 1 nm to about 5 nm thinner than the insulative structures of the first portion; and
    the insulative structures of the fifth portion are about 1 nm to about 5 nm thinner than the insulative structures of the fourth portion.

13. A microelectronic device, comprising:
a lower deck comprising a first stack structure, the first stack structure comprising:
  a first portion comprising a first vertically alternating sequence of insulative structures and conductive structures arranged in tiers;
  a second portion above the first portion, the second portion comprising a second vertically alternating sequence of insulative structures and conductive structures arranged in tiers; and
  a third portion above the second portion, the third portion comprising a third vertically alternating sequence of insulative structures and conductive structures arranged in tiers,
  the insulative structures of the first portion having greater thicknesses than thicknesses of the insulative structures of the third portion, and
an upper deck above the lower deck, the upper deck comprising a second stack structure, the second stack structure comprising:
  a fourth portion above the third portion of the lower deck, the fourth portion comprising a fourth vertically alternating sequence of insulative structures and conductive structures arranged in tiers; and
  a fifth portion above the fourth portion, the fifth portion comprising a fifth vertically alternating sequence of insulative structures and conductive structures arranged in tiers,
  the insulative structures of the fourth portion having greater thicknesses than thicknesses of the insulative structures of the third portion,
wherein the insulative structures of the fourth portion are about as thick as the insulative structures of the second portion.

14. A microelectronic device, comprising:
a lower deck comprising a first stack structure, the first stack structure comprising:
  a first portion comprising a first vertically alternating sequence of insulative structures and conductive structures arranged in tiers;
  a second portion above the first portion, the second portion comprising a second vertically alternating sequence of insulative structures and conductive structures arranged in tiers; and
  a third portion above the second portion, the third portion comprising a third vertically alternating sequence of insulative structures and conductive structures arranged in tiers,
  the insulative structures of the first portion having greater thicknesses than thicknesses of the insulative structures of the third portion, and
an upper deck above the lower deck, the upper deck comprising a second stack structure, the second stack structure comprising:
  a fourth portion above the third portion of the lower deck, the fourth portion comprising a fourth vertically alternating sequence of insulative structures and conductive structures arranged in tiers; and a fifth portion above the fourth portion, the fifth portion comprising a fifth vertically alternating sequence of insulative structures and conductive structures arranged in tiers, the insulative structures of the fourth portion having greater thicknesses than thicknesses of the insulative structures of the third portion, wherein:
- a quantity of the insulative structures of the first portion is about 10% or less of a total quantity of the insulative structures of the lower deck;
- a quantity of the insulative structures of the second portion is about another 10% or less of the total quantity of the insulative structures of the lower deck; and
- a quantity of the insulative structures of the third portion is at least 50% of the total quantity of the insulative structures of the lower deck.

15. A method of forming a microelectronic device, the method comprising:
   forming a stack structure comprising a vertically alternating sequence of insulative structures and sacrificial structures arranged in tiers, comprising:
      forming some of the insulative structures and some of the sacrificial structures in a lower portion of the stack structure; and
      forming some other of the insulative structures and some other of the sacrificial structures in an upper portion of the stack structure,
      the some of the insulative structures within the lower portion of the stack structure being formed to be thicker than the some other of the insulative structures within the upper portion of the stack structure;
   forming at least one tapering feature extending vertically through the stack structure;
   removing the sacrificial structures to form gaps between vertically neighboring pairs of the insulative structures; and
   forming at least one conductive material within the gaps to form conductive structures vertically alternating with the insulative structures, whereby the lower portion comprises some of the conductive structures providing some word lines of the microelectronic device and the upper portion comprises some other of the conductive structures providing some other word lines of the microelectronic device,
   wherein the some of the insulative structures vertically space the some word lines from one another, and the some other of the insulative structures vertically space the some other word lines from one another.

16. The method of claim 15, wherein forming the stack structure further comprises forming the sacrificial structures to a consistent thickness through a height of the stack structure.

17. The method of claim 15, wherein forming the stack structure further comprises forming the sacrificial structures to a greater thickness throughout the lower portion of the stack structure than throughout the upper portion of the stack structure.

18. The method of claim 15, wherein forming the at least one tapering feature extending vertically through the stack structure comprises forming the at least one tapering feature to taper in width from upper elevations of the stack structure to lower elevations of the stack structure.

19. The method of claim 15, further comprising, before removing the sacrificial structures:
   forming at least one slit extending vertically through the stack structure.

20. A system, comprising:
   a three-dimensional array of memory devices comprising:
      a stack structure comprising a vertically alternating sequence of insulative structures and conductive structures arranged in tiers, the stack structure having a first portion and a second portion above the first portion, at least some of the conductive structures providing word lines; and
      features extending vertically through the stack structure, each of the features tapering in lateral width through the stack structure,
      sections of the insulative structures of the first portion of the stack structure spanning a greater lateral distance between neighboring features, of the features, than a lateral distance between the neighboring features spanned by sections of the insulative structures of the second portion of the stack structure,
      the insulative structures vertically interleaved with the word lines of the first portion having greater thicknesses than thicknesses of the insulative structures vertically interleaved with the word lines of the second portion;
   at least one processor in operable communication with the three-dimensional array of memory devices; and
   at least one peripheral device in operable communication with the at least one processor.

21. The system of claim 20, wherein each of the conductive structures within the first portion of the stack structure are thicker than each of the conductive structures within the second portion of the stack structure.

* * * * *